(12) United States Patent
Key et al.

(10) Patent No.: US 7,223,633 B2
(45) Date of Patent: May 29, 2007

(54) METHOD FOR SOLDER CRACK DEFLECTION

(75) Inventors: Chung C. Key, Kedah (MY);
Mustapha Mohd. Faizul, Kedah (MY);
Tan Siew Sang, Kedah (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/306,946

(22) Filed: Nov. 27, 2002

(65) Prior Publication Data
US 2004/0102029 A1 May 27, 2004

(51) Int. Cl.
*H01L 21/44* (2006.01)
(52) U.S. Cl. .............. 438/108; 257/E21.511
(58) Field of Classification Search ........ 438/612–614, 438/478, 184, 193, 195–198, 200–203, 206–207, 438/209–211, 218, 237, 165, 294, 308, 337, 438/353, 5–7, 10–11, 104, 106–114, 118, 438/141–123, 128, 129, 135, 142, 145, 149, 438/151, 157; 257/772
See application file for complete search history.

(56) References Cited

U.S. PATENT DOCUMENTS

| 5,461,261 | A | * | 10/1995 | Nishiguchi | 257/781 |
|---|---|---|---|---|---|
| 5,551,627 | A | * | 9/1996 | Leicht et al. | 228/180.22 |
| 6,046,101 | A | | 4/2000 | Dass et al. | |
| 6,162,660 | A | * | 12/2000 | LaFontaine et al. | 438/108 |
| 6,176,947 | B1 | | 1/2001 | Hwang et al. | |
| 6,204,089 | B1 | * | 3/2001 | Wang | 438/108 |
| 6,225,206 | B1 | * | 5/2001 | Jimarez et al. | 438/616 |
| 6,281,106 | B1 | * | 8/2001 | Higdon et al. | 438/613 |
| 6,373,717 | B1 | * | 4/2002 | Downes et al. | 361/795 |
| 6,413,849 | B1 | * | 7/2002 | Yeoh et al. | 438/612 |
| 6,429,388 | B1 | | 8/2002 | Interrante et al. | |
| 6,444,489 | B1 | | 9/2002 | Lin | |
| 6,492,197 | B1 | * | 12/2002 | Rinne | 438/612 |
| 6,610,591 | B1 | * | 8/2003 | Jiang et al. | 438/613 |
| 2004/0079194 | A1 | * | 4/2004 | Nakata et al. | 75/255 |
| 2004/0197955 | A1 | * | 10/2004 | Lee et al. | 438/108 |
| 2004/0219716 | A1 | * | 11/2004 | Warner et al. | 438/108 |

\* cited by examiner

*Primary Examiner*—Walter Lindsay, Jr.
*Assistant Examiner*—Andre' Stevenson
(74) *Attorney, Agent, or Firm*—Blakely, Sokoloff, Taylor & Zafman LLP (57) ABSTRACT

An apparatus that includes a first component defining an interior of the apparatus; a first solder composition exterior to the first component; a second solder composition exterior to the first solder composition and the first component; and a second component exterior to the second solder composition, the first solder composition, and the first component.

19 Claims, 6 Drawing Sheets

METHOD FOR SOLDER CRACK DEFLECTION

BACKGROUND

1. Field

The present invention relates generally to the bonding of components in an electronic system.

2. Relevant Art

Microprocessors and many other complex electrical components may consist of a package that houses an integrated circuit (IC). The package, which acts as an electrical bridge between the IC and a printed circuit board, includes a substrate and an internal metallurgy system that routes power, ground, and signals between the printed circuit board and an IC attached to the substrate.

A package is typically connected to a printed circuit board using either a set of input/output pins (e.g., a "pin grid array") or solder balls (e.g., a "ball grid array"). In a pin grid array package, arrays of input/output pins are connected to the bottom surface of the package. During assembly of a printed circuit board, the pin grid array is mated to a complimentary socket on the printed circuit board. One advantage to using pin grid array packages is that the package can later be removed from the printed circuit board and replaced.

Two technologies for manufacturing pin grid array packages are commonly used in the semiconductor manufacturing industry. These technologies are surface mount technology and wire bond technology. Surface mount technology involves attaching pins to conductive pads on the bottom surface of a ceramic substrate, thus forming electrical connections with the internal package routing system.

Because organic packages cannot be heated to extremely high temperatures without becoming damaged, and because it is impractical to surface mount pins using commonly used tin-lead (Sn—Pb) solder, wire bond technology is generally used to create organic packages with pin grid arrays.

Wire bond packages are generally larger than the IC that a package houses, since the package must accommodate the peripheral, inserted pin grid array. In order to reduce the size of organic packages, "flip-chip" ball grid array packages may be used. A "flip-chip" is a chip in which power, ground, and signal leads are brought to pads anywhere on the top surface of the chip. Sn—Pb solder bumps are then printed onto the pads, and the chip is turned upside down, and aligned with pads on the top surface of the package.

On the bottom of the package, a ball grid array is provided in order to attach the package to the printed circuit board. The ball grid array generally consists of solder balls that are attached to pads on the bottom of the package. These pads are then aligned with matching pads on the printed circuit board, and the board is heated, causing the solder to melt and form contacts between the package pads and the board pads. Flip-chip ball grid array packages can be substantially smaller than wire bond packages.

Connections are made in electronic systems by flip chip ball grid arrays (BGA), and other BGA types, for example, Flip Chip BGA, Wire Bond Plastic BGA, Ceramic BGA, micro BGA, very fine BGA, T-BGA, Chip Scale Package, etc.

There is a need in the art for a strong, stable bond between components in an electronic system.

The features of the described embodiments are specifically set forth in the appended claims. Referring to the following description and accompanying drawings, in which similar parts are identified by like reference numerals, best understand the embodiments.

DETAILED DESCRIPTION

Figure 1:
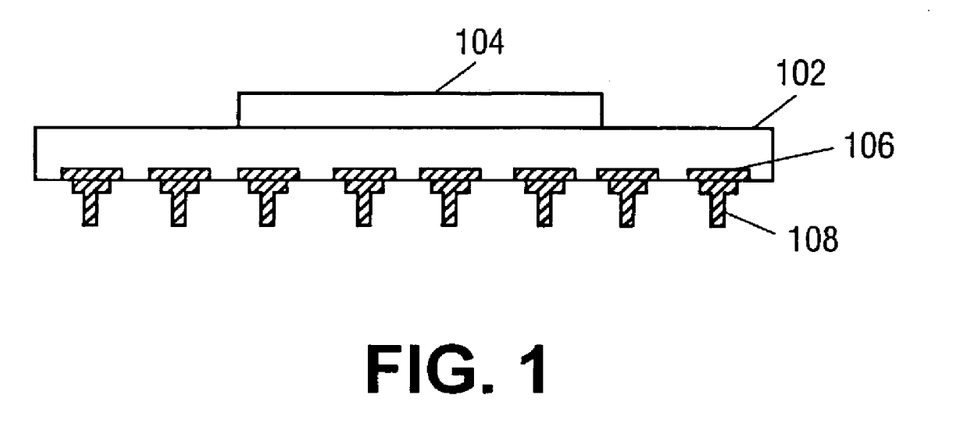
FIG. 1 illustrates a cross-sectional view of a pin grid array integrated circuit package.

FIG. 1 illustrates a cross-sectional view of a ceramic, pin grid array integrated circuit package. Ceramic substrate 102 houses integrated circuit 104 on a top surface of the substrate. Attached to pin pads 106 on a bottom surface of substrate 102 are surface mount pins 108. During manufacture of the package, surface mount pins 108 may be brazed or soldered to substrate 102.

Figure 2:
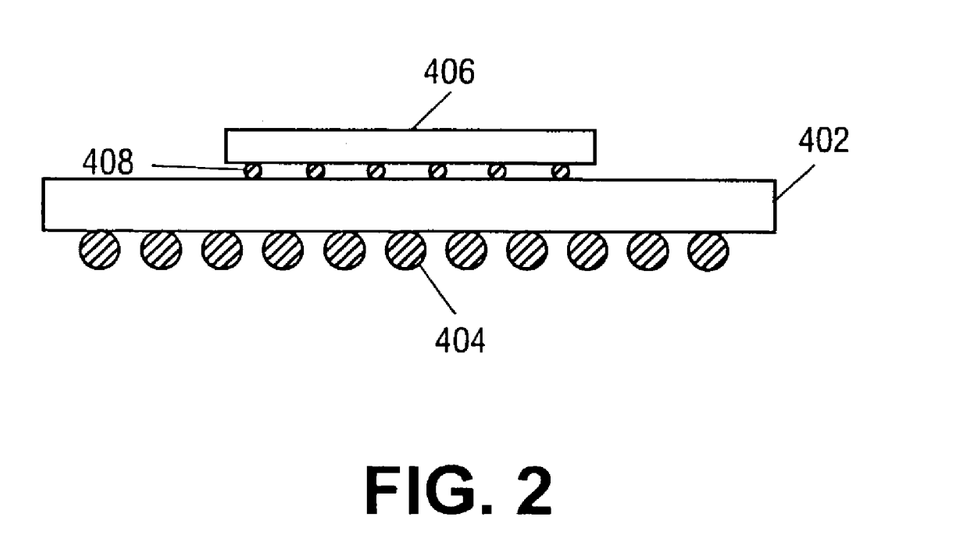
FIG. 2 illustrates a side view of a flip-chip, ball grid array integrated circuit package.

FIG. 2 illustrates a side view of a flip-chip ball grid array package. The package includes organic substrate 402 having array of solder balls 404 attached to a bottom surface of substrate 402. IC 406 is attached to a top surface of substrate 402 by solder bumps 408.

Figure 3:
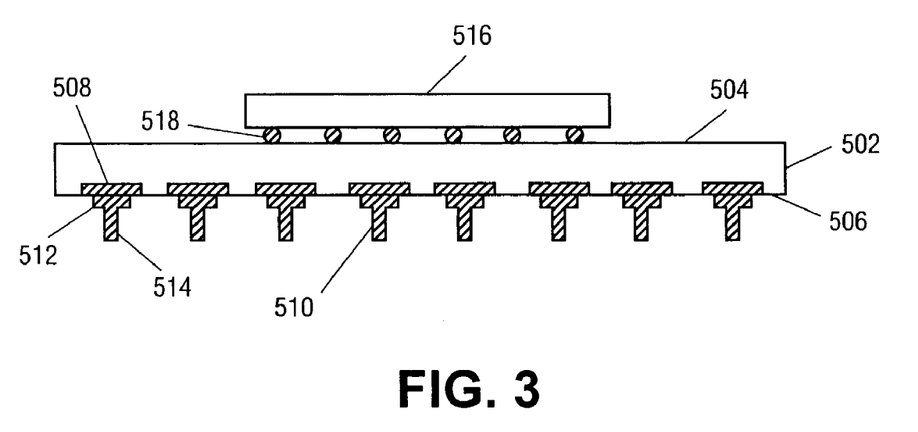
FIG. 3 illustrates a side view of an integrated circuit package with a plurality of surface mount pins attached to a substrate.
Figure 5:
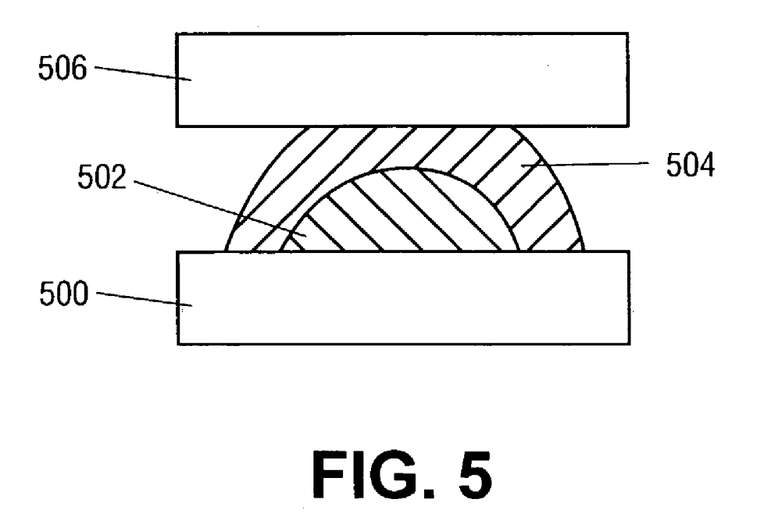
FIG. 5 schematically illustrates a cross-sectional view of a first component having a first solder composition and a second solder composition on a surface thereof connecting the first component to a second component.

FIG. 3 illustrates a side view of an integrated circuit package with a plurality of surface mount pins attached to a substrate. The package includes substrate 502 (for example organic or non-organic) having top surface 504 and bottom surface 506. In one embodiment, substrate 502 could be any number of commonly used organic or inorganic materials, such as FR-5 or FR-4 epoxy-glass, polymide-glass, benzo-cyclobutene, Teflon, other epoxy resins, or the like in various embodiments. Typically, substrate 502 would have embedded therein a multilayer metallurgical system of interconnects (not shown), which electrically connect bonding pads on top surface 504 to pin pads 508 on bottom surface 506. FIG. 5 illustrates pin pads 508, but does not illustrate the interconnection between pads.

On bottom surface 506, surface mount pins 510 are attached to pin pads 508 on substrate 502, for example by brazing or soldering. In one embodiment, pins 510 are butt-head pins having a flattop head 512 and a post 514. In one embodiment, the diameter of pinhead 512 may be less than the diameter of pin pad 508. The dimensions of pad 508 and pinhead 512 can be chosen to best suit the particular application. In one embodiment, the outer edge of pinhead 512 is displaced inwardly from the outer edge of pad 508 by at least 0.005 inch, and in another embodiment, in the range of 0.015 to 0.025 inch. However, displacements greater or less than this range could also be used in other embodiments.

In one embodiment, pins 510 may be soldered to the central portions of pads 508.

IC 516 is electrically and mechanically connected to top surface 504 of substrate 502 via solder bumps 518. During the assembly process, pads on IC 516 and substrate 504 are aligned, and the solder bumps are heated to a temperature sufficient to melt the solder. The solder then flows onto adjoining pads (not shown) on top surface 504 of substrate 502. When cooled, IC 516 is firmly attached to substrate 502.

Figure 4:
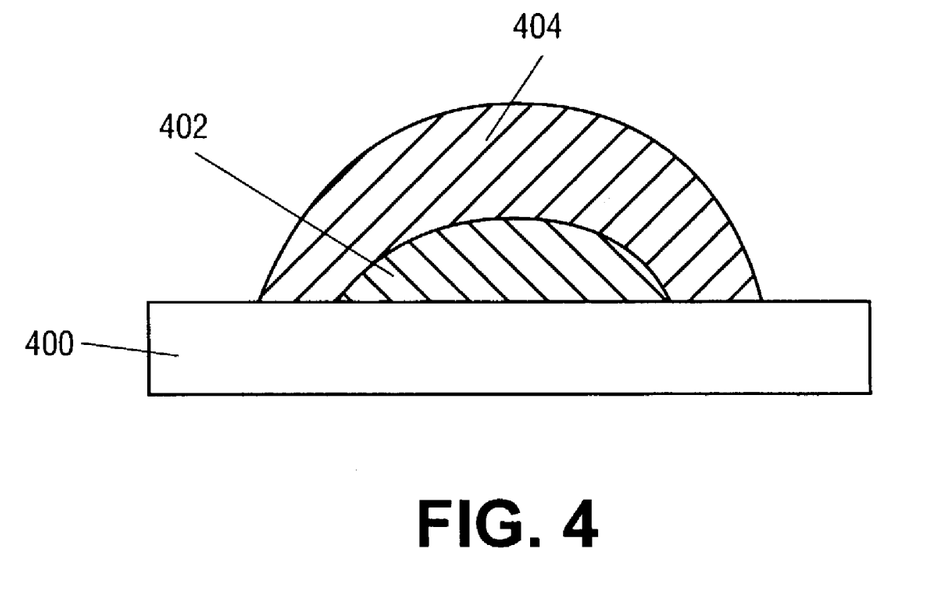
FIG. 4 schematically illustrates a cross-sectional view of a first component having a first solder composition and a second solder composition on a surface thereof.

Referring now to FIG. 4, first component 400 has first solder material 402, and second solder material 404 surrounding first solder material 402. In one embodiment, first component 400 defines an interior of an assembly, with first solder material 402 exterior to first component 400, and second solder material 404 exterior to first solder material 402 and first component 400. First component 400 may be, for example, a conductive pad on an IC or package substrate.

Referring now to FIG. 5, there is illustrated a connection between two components. First component 500 is shown with first solder material 502 connected to first component 500. Second solder material 504 surrounds first solder material 502. Second component 506 is adjacent to second solder material 504. Second solder material 504 may also be connected to first component 500. First component 500 and second component may be, for example, a conductive pad.

In one embodiment, first component 500 defines an interior of an assembly. First solder material 502 is exterior to first component 500. Second solder material 504 is exterior to first solder material 502 and first component 500. Second component 506 is exterior to second solder material 504, first solder material 502, and first component 500.

In one embodiment, other solder materials and/or other components can be located between or adjacent to one or more of first component 500, first solder material 502, second solder material 504, and/or second component 506.

In one embodiment, first solder material 402 and/or 502 is stronger than second solder material 404 and/or 504. In another embodiment, first solder material 402 and/or 502 has a higher melting point than second solder material 404 and/or 504. In another embodiment, first solder material 402 and/or 502 has a higher shear strength than second solder material 404 and/or 504. In another embodiment, first solder material 402 and/or 502 has a higher tensile strength than second solder material 404 and/or 504.

In one embodiment, a solder's melting temperature depends on the composition of the solder.

In one embodiment, the first solder composition is a Sn—Sb composition with about 5 percent Sb by weight, with a melting temperature of about 240 degrees Celsius, while the second solder composition is a Sn—Sb composition with less than about 5 percent Sb by weight. Generally, if the composition includes a higher percentage of Sb, the melting temperature will be higher, and if the composition includes a lower percentage of Sb, the melting temperature will be lower.

In one embodiment, the first solder composition is a Sn—Sb composition with the amount of Sb in the range of about 4 to about 10 percent by weight. This composition has been shown to have a melting temperature that is higher than the melting temperature of the second solder composition which is a Sn—Pb solder.

In one embodiment the first solder composition contains about 5 percent Sb by weight. This composition has a melting temperature of about 240 degrees Celsius. In one embodiment, the second solder composition has a melting temperature of about 230 degrees Celsius for a Sn—Pb composition having 95 percent Sn by weight. The first and/or second compositions may include other elements as well.

In one embodiment, the second solder composition is a tin-lead (Sn—Pb) solder composition. Using a composition that includes from 60 to 95 percent Sn by weight, the melting temperature of Sn—Pb solder is within a range of 190 to 230 degrees Celsius. In one embodiment, the first solder composition is a tin-antimony (Sn—Sb) solder composition, which has a melting temperature that is higher than the melting temperature of most Sn—Pb solder compositions. In one embodiment, the melting temperature of the Sn—Sb solder composition is approximately 240 degrees Celsius, well above the melting temperature of Sn—Pb solder.

In another embodiment, for a lead free system, the first and/or second solder compositions could be selected from a group comprising tin/antimony (with tin being between about 55 to about 95 weight percent), tin/silver, tin/silver/copper (with silver and copper being between about 0.5 to about 3.0 weight percent), tin/silver/bismuth (with silver being between about 2.0 to about 4.5 weight percent and bismuth being between about 3.5 to about 7.5 weight percent), tin/silver/copper (with silver being between about 2.0 to about 4.5 weight percent and copper being between about 0.5 to about 3.0 weight percent), to name a few.

In another embodiment, for a lead free system, the first and/or second solder compositions could be selected from a group comprising tin/antimony (with tin being between about 55 to about 95 weight percent), tin/silver, tin/silver/copper (with silver and copper being between about 0.5 to about 3.0 weight percent), tin/silver/bismuth (with silver being between about 2.0 to about 4.5 weight percent and bismuth being between about 3.5 to about 7.5 weight percent), tin/silver/copper (with silver being between about 2.0 to about 4.5 weight percent and copper being between about 0.5 to about 3.0 weight percent), tin/zinc (with tin being about 91 weight percent), tin/bismuth (with tin being about 42 weight percent), to name a few.

In one embodiment, the first solder composition is 95/5Sn/Sb or Sn/Ag (with Ag in the range of between about 3 to about 5 weight percent), which melts in the range of between about 220.degree. C. to about 240.degree. C.

In one embodiment, the second solder composition is 48/52Sn/In or 43/57 Sn/Bi, which melts in the range of between about 120.degree. C. to about 140.degree. C.

In one embodiment, the second solder composition is Pb—Sn eutectic solder of 63 Sn/37 Pb which has a moderate melting temperature, particularly about 183 degree. C.

In another embodiment, the first and/or second solder compositions could be selected from solder alloys that include about 76 to 96 weight % Sn, about 0.2 to 2.5 weight % Cu, about 2 to 4.5 weight % Ag, about 0 to 12 weight % In, about 0 to 5.0 weight % Bi and about 0 to 2 weight % Sb. In one embodiment, the composition will include at least about 2.0 weight % In. In another embodiment, the composition will include at least 0.5 weight % Bi. In another embodiment, the composition will include greater than about 0 weight % Sb. In another embodiment, greater than about 0.01 weight % Sb.

In another embodiment, the first and/or second solder compositions could be selected from solder alloys that include about 81 to 93% Sn, about 0.2 to 1.0% Cu, about 2.5 to 4.5% Ag, and about 6 to 12% In. Unless otherwise identified in the descriptions and claims, all parts and percentages are by weight.

In one embodiment, Cu and Ag combined in proper dosages increase the fatigue resistance and lower the melting temperature of solder alloys. In one embodiment, the second solder composition includes at least about 0.5% Cu, and the first solder composition includes less than about 0.5% Cu.

In one embodiment, the second solder composition includes at least about 3.0% Ag, and the first solder composition includes less than about 3.0% Ag.

In one embodiment, the second solder composition includes at least about 3.0% to about 12.0% In, and the first solder composition includes from about 0% to about 9.0% In. In another embodiment, the first solder composition includes at least about 3.0% less In than the second solder composition.

In one embodiment, the first and/or second solder compositions includes at least about 0% to about 5.0% Bi.

In one embodiment, the first solder composition includes at least about 2.0% to about 10.0% Sb, and the second solder composition includes from about 0% to about 8.0% Sb. In another embodiment, the second solder composition includes at least about 2.0% less Sb than the first solder composition.

In one embodiment, the second solder composition is a 63 Sn/37 Pb solder with a melting temperature of about 183.degree. C. In another embodiment, the first solder composition is a 99.3 Sn 0.7 Cu solder with a melting temperature of about 227.degree. C. In another embodiment, the first solder composition is a 96.5 Sn 3.5 Ag solder with a melting temperature of about 227.degree. C.

Figure 6:
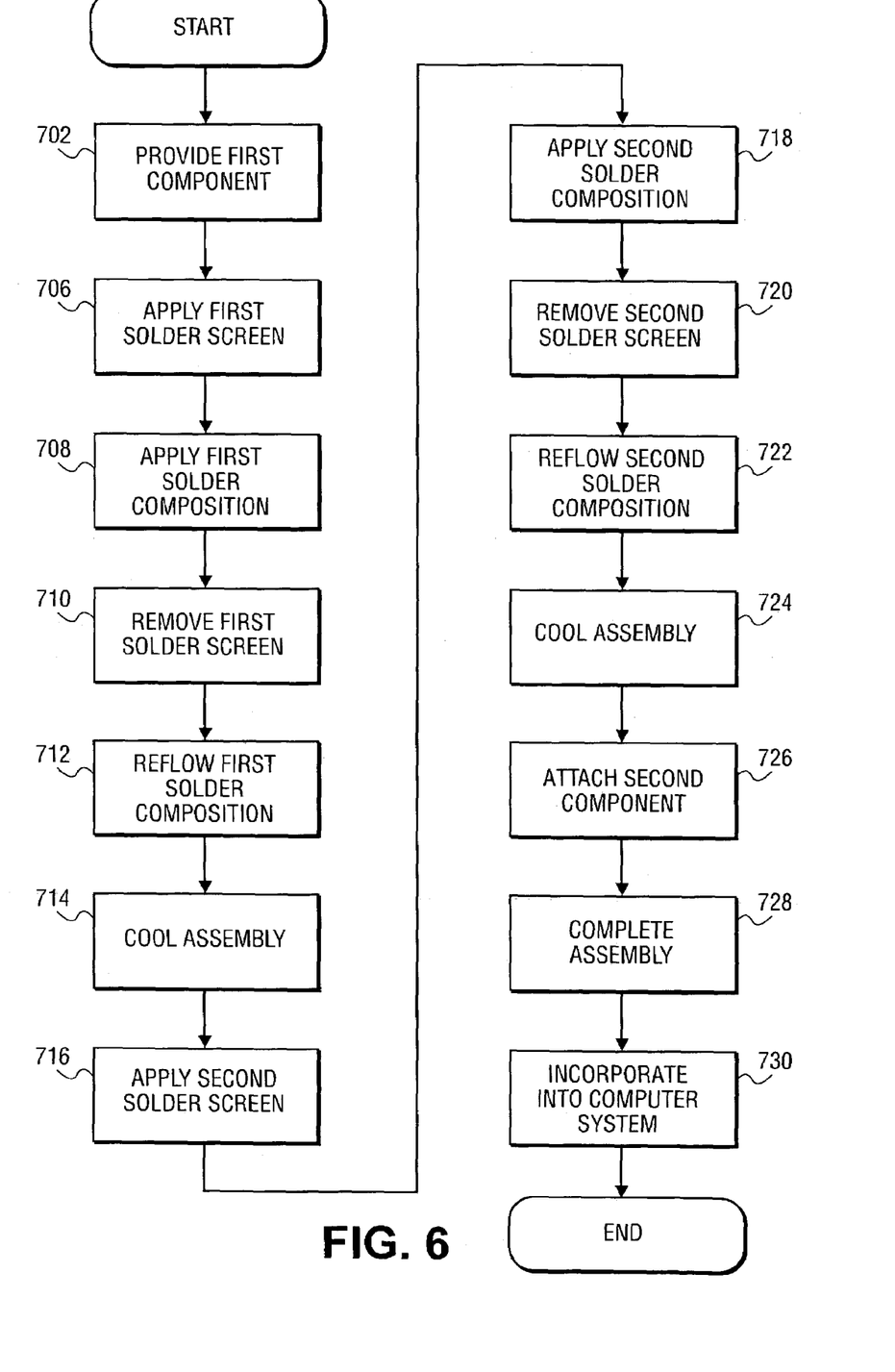
FIG. 6 illustrates a flowchart of a method for attaching a second component to a first component for a first level interconnect.

FIG. 6 illustrates a flowchart of a method for attaching a first component to a second component, for example for a first level interconnects. The method begins, in block 702, by providing a first component. In one embodiment, the first component is an organic substrate having a multi-level metallurgical system of interconnects and pads. In other embodiments, the first component can have only a single level of metallurgical connections, or can be an inorganic substrate.

In block 706, a first solder screen is placed over the first component. Generally, the first solder screen is a metal pattern (e.g., stainless steel) having holes that line up with desired solder locations on the first component. A first solder paste is applied over the first solder screen in block 708. A squeegee process is then performed, to deposit the first solder paste into the holes in the first solder screen, and thus desired solder locations on the first component. The amount of solder deposited in each hole is a function of the size of the holes and the thicknesses of the first solder screen and the desired thickness of the solder on the first component. Thus, the dimensions of the holes and the thicknesses of the first solder screen are selected based on the particular application. As will be explained below, the amount of solder deposited in each hole may affect the strength of the connection.

In block 710, the first solder screen is removed. The assembly is then heated, in block 712, to a temperature sufficient to reflow the solder. As discussed previously, the first solder composition may have a melting temperature that is higher than a melting temperature of solder used elsewhere in the component. However, the melting temperature of the first solder may be lower than a temperature that would damage the first component.

In block 714, the assembly is cooled in a controlled manner, to allow the solder to solidify. If the first solder composition has a greater percentage of antimony (Sb) by weight, the cooling process may need to be more carefully controlled, in order to mitigate the possible effects of phase separation.

In block 716, a second solder screen is placed over the first component. Generally, the second solder screen is a metal pattern (e.g., stainless steel) having holes that line up with desired solder locations on the first component. A second solder paste is applied over the solder screen in block 718. A squeegee process is then performed, to deposit the second solder paste into the holes in the second solder screen, and thus desired solder locations on the first component. The amount of solder deposited in each hole is a function of the size of the holes and the thicknesses of the second solder screen and the desired thickness of the solder on the first component. Thus, the dimensions of the holes and the thicknesses of the second solder screen are selected based on the particular application. As will be explained below, the amount of solder deposited in each hole may affect the strength of the connection.

In block 720, the second solder screen is removed. The assembly is then heated, in block 722, to a temperature sufficient to reflow the second solder composition.

In block 724, the assembly is cooled in a controlled manner, to allow the solder to solidify.

Once the first and second solder compositions are solidified, the package can be re-heated to melting temperature of second solder composition to attach the second component, in block 726, for example, using a solder reflow process.

Once the second component is attached, the assembly can be completed, in block 728. Completing the assembly typically involves hermetically sealing the assembly in order to protect the first and/or second components. The completed assembly can then be incorporated into a computer system in block 730, and the method ends.

Figure 7:
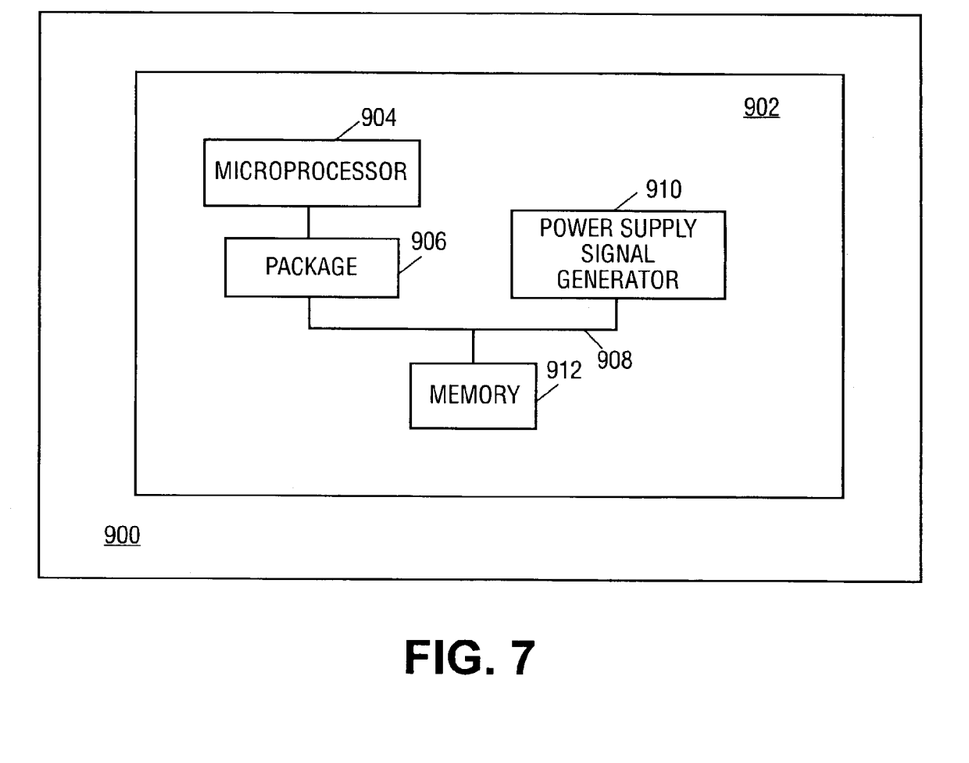
FIG. 7 illustrates a general purpose computer system.

FIG. 7 illustrates a general-purpose computer system. Computer system 900 is housed on PC board 902, and includes bus 908, microprocessor 904, package 906, power supply signal generator 910, and memory 912. Package 906 includes surface mount pins that enable microprocessor 904 to be coupled to bus 908 through a socket on the PC board 902. The coupling of microprocessor 904 to bus 908 via package 906 enables power supply signals and non-power supply signals to be communicated between microprocessor 904 and devices coupled to bus 908. In one embodiment, bus 908 couples microprocessor 904 to memory 912 and power supply signal generator 910. However, it is to be understood that in alternative embodiments of the present invention, microprocessor 904 can be coupled to memory 912 and power supply signal generator 910 through two different busses. In addition, in alternative embodiments of the present invention, power supply signal generator 910 is not positioned on PC board 902, but instead is positioned elsewhere.

Figure 8:
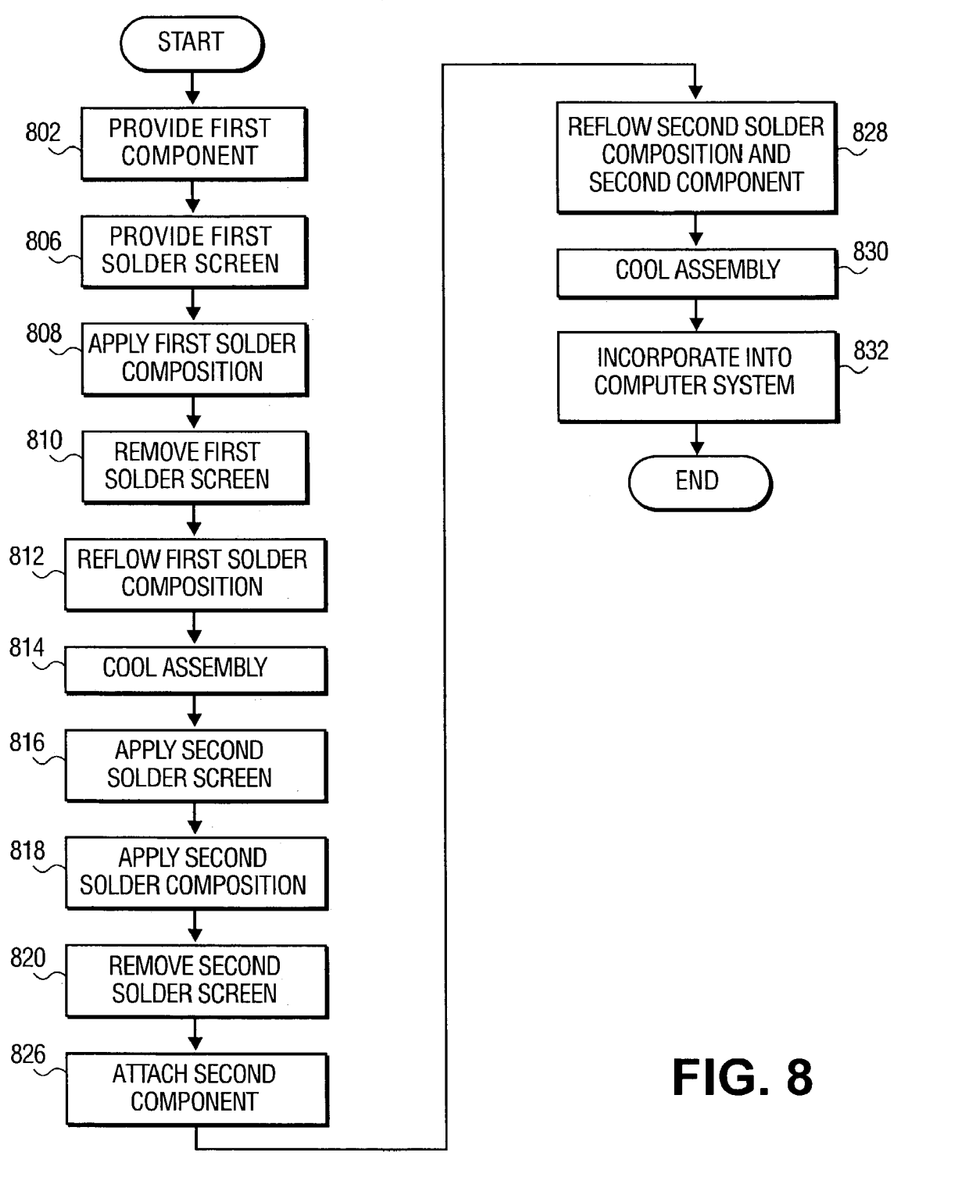
FIG. 8 illustrates a flowchart of a method for attaching a second component to a first component for a second level interconnect.

FIG. 8 illustrates a flowchart of a method for attaching a first component to a second component, for example for a second level interconnects. The method begins, in block 802, by providing a first component. In one embodiment, the first component is an organic substrate having a multi-level metallurgical system of interconnects and pads. In other embodiments, the first component can have only a single level of metallurgical connections, or can be an inorganic substrate.

In block 806, a first solder screen is placed over the first component. Generally, the first solder screen is a metal pattern (e.g., stainless steel) having holes that line up with desired solder locations on the first component. A first solder paste is applied over the first solder screen in block 808. A squeegee process is then performed, to deposit the first solder paste into the holes in the first solder screen, and thus desired solder locations on the first component. The amount of solder deposited in each hole is a function of the size of the holes and the thickness of the first solder screen and the desired thickness of the solder on the first component. Thus, the dimensions of the holes and the thickness of the first solder screen are selected based on the particular application. As will be explained below, the amount of solder deposited in each hole may affect the strength of the connection.

In block 810, the first solder screen is removed. The assembly is then heated, in block 812, to a temperature sufficient to reflow the solder. As discussed previously, the first solder composition may have a melting temperature that is higher than a melting temperature of solder used elsewhere in the component. However, the melting temperature of the first solder may be lower than a temperature that would damage the first component.

In block 814, the assembly is cooled in a controlled manner, to allow the solder to solidify. If the first solder composition has a greater percentage of antimony (Sb) by weight, the cooling process may need to be more carefully controlled, in order to mitigate the possible effects of phase separation.

In block 816, a second solder screen is placed over the first component. Generally, the second solder screen is a metal pattern (e.g., stainless steel) having holes that line up with desired solder locations on the first component. A second solder paste is applied over the solder screen in block 818. A squeegee process is then performed, to deposit the second solder paste into the holes in the second solder screen, and thus desired solder locations on the first component. The amount of solder deposited in each hole is a function of the size of the holes and the thickness of the second solder screen and the desired thickness of the solder on the first component. Thus, the dimensions of the holes and the thickness of the second solder screen are selected based on the particular application. As will be explained below, the amount of solder deposited in each hole may affect the strength of the connection.

In block 820, the second solder screen is removed.

In block 826, the second component is attached. The assembly is heated in block 828 to a temperature sufficient to reflow the second solder composition. In block 830, the assembly is cooled in a controlled manner, to allow the solder to solidify.

The assembly can then be incorporated into a computer system in block 832, and the method ends.

In one embodiment there is disclosed an apparatus that includes a first component defining an interior of the apparatus; a first solder composition exterior to the first component; a second different solder composition exterior to the first solder composition and the first component; and a second component exterior to the second solder composition, the first solder composition, and the first component.

In another embodiment there is disclosed an apparatus wherein the first solder composition either tougher and/or stronger than the second solder composition.

In another embodiment there is disclosed an apparatus wherein the first solder composition has higher shear strength than the second solder composition.

In another embodiment there is disclosed an apparatus wherein the first solder composition has a higher melting point than the second solder composition.

In another embodiment there is disclosed an apparatus wherein the first solder composition defines a dome shape having a height of about 0.1× to about 0.2× of a height of solder bump 408, for example for a first level interconnect. In another embodiment there is disclosed an apparatus wherein the first solder composition defines a dome shape having a height of about 0.075× to about 0.3× of a height of solder bump 408, for example for a first level interconnect. In another embodiment there is disclosed an apparatus wherein the first solder composition defines a dome shape having a height of about 0.05× to about 0.4× of a height of solder bump 408, for example for a first level interconnect.

In another embodiment there is disclosed an apparatus wherein the first solder composition defines a dome shape having a height of about 0.1 to about 0.2× of a diameter of solder ball 404, for example for a second level interconnect. In another embodiment there is disclosed an apparatus wherein the first solder composition defines a dome shape having a height of about 0.075× to about 0.3× of a diameter of solder ball 404, for example for a second level interconnect. In another embodiment there is disclosed an apparatus wherein the first solder composition defines a dome shape having a height of about 0.05× to about 0.4× of a diameter of solder ball 404, for example for a second level interconnect.

In another embodiment there is disclosed an apparatus wherein the first solder composition comprises tin, silver, copper, and less than about 0.5% antimony.

In another embodiment there is disclosed an apparatus that includes a first component; a first solder composition attached to a surface of the first component; a second different solder composition adjacent to, overlaying, and completely enclosing the first solder composition, wherein the second solder composition is attached to the first solder composition and the first component; and a second component attached to the second solder composition, wherein the first and second solder compositions form a laminate connection structure between the first component and the second component.

In another embodiment there is disclosed a method that includes depositing a first solder composition on a first component; depositing a second different solder composition on the first composition; attaching a second component to the second solder composition to form a connection between the first component and the second component.

In another embodiment there is disclosed a method or technique to be used for a Flip Chip Ball Grid Array (BGA) process. In another embodiment there is disclosed a method or technique for all second level of interconnect (package to board) on BGA interconnect type, for example, Flip Chip BGA, Wire Bond Plastic BGA, Ceramic BGA, micro BGA, very fine BGA, T-BGA, Chip Scale Package, etc.

In the preceding detailed description, specific embodiments were described. It will, however, be evident that various modifications and changes may be made thereto without departing from the broader spirit and scope as set forth in the claims. The specification and drawings are, accordingly, to be regarded in an illustrative rather than a restrictive sense.

The invention claimed is:

1. A method comprising:
depositing a first solder composition on and physically touching a first electrically conductive component;
depositing a second different solder composition on and physically touching the first composition;
attaching a second electrically conductive component to the second solder composition, wherein the second solder composition is physically touching the first component and the second component, wherein the first solder composition has a higher melting point than the second solder composition.

2. The method of claim 1, wherein the first solder composition is at least one of tougher and stronger than the second solder composition.

3. The method of claim 1, wherein the first solder composition has a higher shear strength than the second solder composition.

4. The method of claim 1, wherein the first solder composition defines a dome shape having a height of about 3 to about 5 mils.

5. The method of claim 1, wherein the first solder composition defines a dome shape having a height of about 0.1 to about 0.2 times a total height of the first solder composition and the second solder composition.

6. The method of claim 1, wherein the first solder composition comprises tin, silver, copper, and less than about 0.5% antimony.

7. A method comprising:
depositing a first solder composition on and physically touching a first electrically conductive component;
depositing a second different solder composition on and physically touching the first solder composition, the second solder composition overlaying and sealing the first solder composition to the first component, wherein the second solder composition is physically touching the first solder composition and the first component;
attaching a second electrically conductive component to and physically touching the second solder composition to form a connection between the first component and the second component, wherein the first solder composition and the second solder composition comprise copper and silver combined in dosages to increase the fatigue resistance and lower the melting temperature of the first solder composition and the second solder composition.

8. The method of claim 7, wherein the first solder composition defines a dome shape having a height of about 3 to about 5 mils.

9. The method of claim 7, wherein the first solder composition defines a dome shape having a height of about 0.1 to about 0.2 times a total height of the first solder composition and the second solder composition.

10. The method of claim 7, wherein the first solder composition comprises tin, silver, copper, and less than about 0.5% antimony.

11. A method of claim 1, wherein the first solder composition comprises tin and antimony, and the second solder composition comprises tin and lead.

12. A method of claim 7, wherein the first solder composition comprises tin and antimony, and the second solder composition comprises tin and lead.

13. A method of claim 1, wherein the first solder composition and the second solder composition comprise at least one of tin, silver, copper, antimony, bismuth and zinc.

14. A method of claim 7, wherein the first solder composition and the second solder composition comprise at least one of tin, silver, copper, antimony, bismuth and zinc; and the first solder composition is tougher, stronger, and has a higher melting point than the second solder composition.

15. A method of claim 13, wherein the first solder composition and the second solder composition comprise copper and silver combined in proper dosages to increase the fatigue resistance and lower the melting temperature of the first solder composition and the second solder composition.

16. A method of claim 15, wherein the first solder composition includes less than 0.5 percent copper and less than three percent silver; and the second solder composition includes at least 0.5 percent copper and at least three percent silver.

17. A method of claim 15, wherein the first solder composition includes less than 0.5 percent copper and less than three percent silver; and the second solder composition includes at least 0.5 percent copper and at least three percent silver.

18. A method comprising:
depositing a first solder composition on and physically touching a first electrically conductive component;
depositing a second different solder composition on and physically touching the first composition;
attaching a second electrically conductive component to the second solder composition, wherein the second solder composition is physically touching the first component and the second component, wherein the first solder composition contains about five percent by weight of antimony and between 55 percent and 95 percent by weight of tin; and the second solder composition comprises between 60 percent and 95 percent by weight of tin and lead; and the first solder composition as the melting temperature that is higher than a melting temperature of the second solder composition.

19. A method of claim 7, wherein the first solder composition contains about five percent by weight of antimony and between 55 percent and 95 percent by weight of tin; and the second solder composition comprises between 60 percent and 95 percent by weight of tin and lead; and the first solder composition as the melting temperature that is higher than a melting temperature of the second solder composition.

* * * * *